(12) United States Patent
Norris et al.

(10) Patent No.: US 6,541,989 B1
(45) Date of Patent: Apr. 1, 2003

(54) TESTING DEVICE FOR SEMICONDUCTOR COMPONENTS AND A METHOD OF USING THE DEVICE

(75) Inventors: Mark D. Norris, Mesa, AZ (US); Jeffrey S. Hughes, Phoenix, AZ (US); Roy Russell Brown, Simi Valley, CA (US)

(73) Assignee: Motorola, Inc., Schaumburg, IL (US)

( * ) Notice: Subject to any disclaimer, the term of this patent is extended or adjusted under 35 U.S.C. 154(b) by 14 days.

(21) Appl. No.: 09/675,994

(22) Filed: Sep. 29, 2000

(51) Int. Cl.⁷ .............................................. G01R 31/02
(52) U.S. Cl. ................... 324/755; 324/158.1; 324/754
(58) Field of Search .............................. 324/765, 158.1, 324/73.1, 754, 763, 758, 755; 165/80.1, 80.2; 361/234

(56) References Cited

U.S. PATENT DOCUMENTS

| | | | |
|---|---|---|---|
| 4,667,944 A | 5/1987 | Althouse | 269/21 |
| 4,711,014 A | 12/1987 | Althouse | 29/412 |
| 4,778,326 A | 10/1988 | Althouse et al. | 414/786 |
| 5,186,238 A * | 2/1993 | del Puerto et al. | 324/158.1 |
| 5,336,649 A | 8/1994 | Kinsman et al. | |
| 5,440,241 A * | 8/1995 | King et al. | 324/765 |
| 5,682,731 A | 11/1997 | Althouse | 53/471 |
| 5,701,666 A * | 12/1997 | Dehaven et al. | 324/754 |
| 5,703,493 A | 12/1997 | Weeks et al. | 324/755 |
| 5,769,237 A | 6/1998 | Althouse et al. | 206/714 |
| 5,885,353 A * | 3/1999 | Strodtbeck et al. | 118/712 |
| 5,946,183 A * | 8/1999 | Yamada et al. | 361/234 |
| 5,999,268 A * | 12/1999 | Youezawa et al. | 324/73.1 |
| 6,084,215 A * | 7/2000 | Furuya et al. | 324/765 |

FOREIGN PATENT DOCUMENTS

| | | |
|---|---|---|
| DE | 4232404 A1 | 3/1994 |
| JP | 60201647 | 10/1985 |
| JP | 07078864 | 3/1995 |

* cited by examiner

Primary Examiner—Kamand Cuneo
Assistant Examiner—Jimmy Nguyen
(74) Attorney, Agent, or Firm—A. Kate Huffman

(57) ABSTRACT

A testing device for semiconductor components and a method of making the device is described. The testing device includes a support structure having an outer edge, and an adhesive film disposed on the support structure to hold a semiconductor wafer in position on the support structure so that neither the adhesive film nor the semiconductor wafer extends beyond the outer edge of the support structure.

17 Claims, 2 Drawing Sheets

TESTING DEVICE FOR SEMICONDUCTOR COMPONENTS AND A METHOD OF USING THE DEVICE

FIELD OF THE INVENTION

This invention pertains to a testing device for semiconductor components and a method of using the device. More particularly, the inventive device that may be used to hold the wafer during processing is utilized to test the resulting wafer for viability.

BACKGROUND OF THE INVENTION

To improve the performance of semiconductor devices, particularly those devices with silicon support structures, support structures have conventionally been thinned using a chemical and mechanical polishing technique. Support structures may be thinned down to a thickness of as low as 25 μm to improve the "on" resistance; however, such thin wafers are quite fragile and susceptible to both warpage and breakage. To combat damage to the thin wafers, wafer holders were developed to transport and process the thin support structures. One type of wafer holder includes a support, and a ring that attaches to the support to hold the wafer in position. The wafer is aligned in the support after the semiconductor support structure is thinned and is further aligned once placed onto a probe chuck.

Accordingly, it would be advantageous to have a wafer holder that accurately aligns a wafer during the thinning process and that may be used to conduct reliable conductivity tests on the finished wafer. It would be a further advantage to provide an adhesive means for aligning the wafer on the holder in a simple and reliable manner.

BRIEF DESCRIPTION OF THE DRAWINGS

The present invention will be better understood from a reading of the following detailed description, taken in conjunction with the accompanying drawing figures in which.

Figure 1:
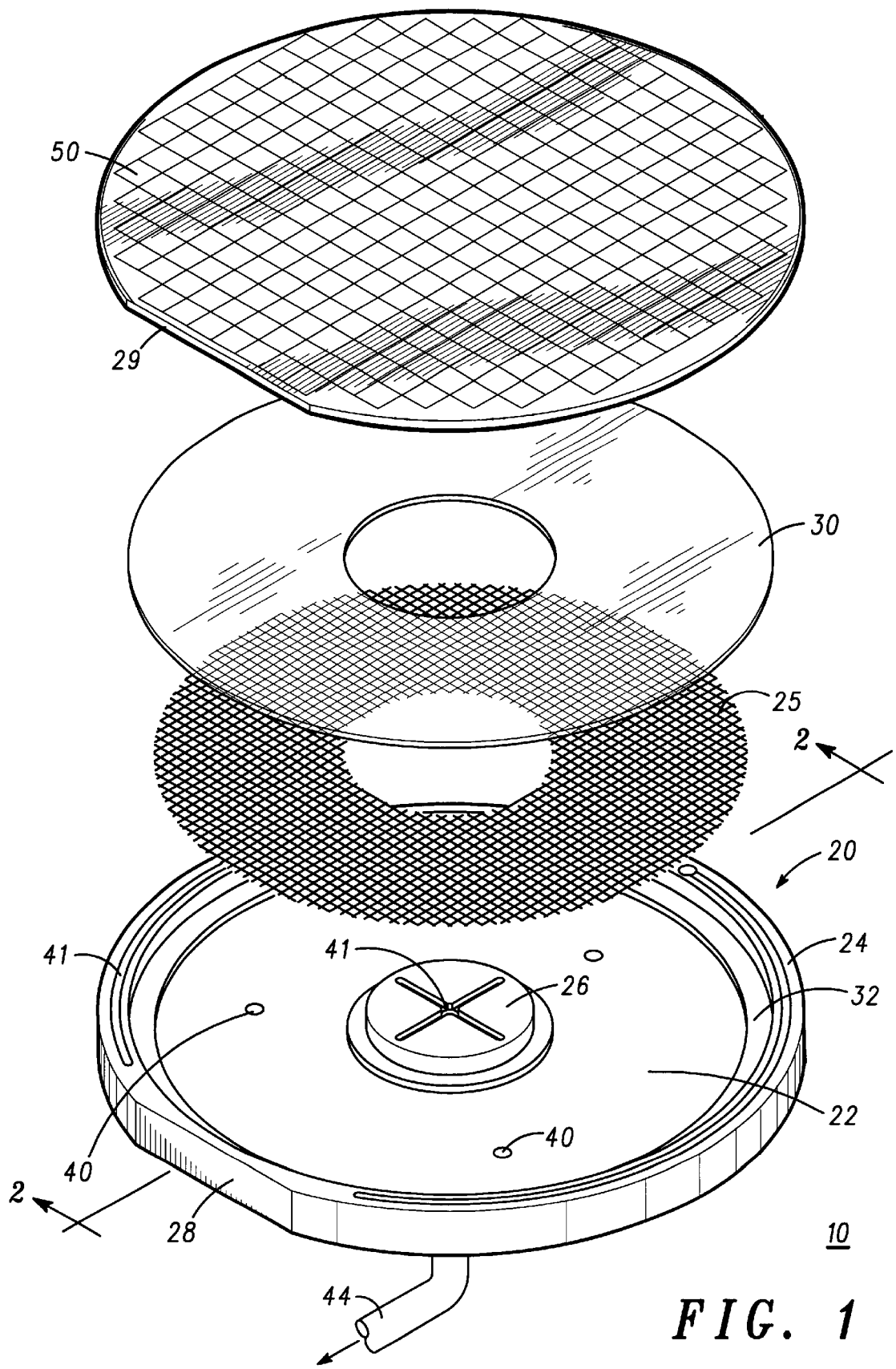
FIG. 1 is an enlarged isometric view of an apparatus according to the present invention.

For simplicity and clarity of illustration, the figures illustrate the general invention, and descriptions and details of well-known features and techniques are omitted to avoid unnecessarily drawn to scale, and the same reference numerals in different figures denote the same elements. It is further understood that the embodiments of the invention described herein are capable of being manufactured or operated in other orientations than described or illustrated herein.

DETAILED DESCRIPTION OF PREFERRED EMBODIMENTS

The testing device 10 according to the invention comprises a support structure 20 that includes a mesh material layer 25 disposed between an adhesive film 30 and the support structure 20. The testing device 10 may be formed to fit any semiconductor substrate 50 used in the industry, but preferably exhibits a circular shape. The testing device 10 is especially effective for testing semiconductor substrates 50 that are less than about 250 μm thick.

Support structure 20 for example, can be fabricated from a material that is electrically conductive such as aluminum, aluminum alloy, nickel, platinum, stainless steel, titanium, copper, or gold. It is also possible to form support structure 20 from a non-conductive material such as quartz, "Delrin", or "Teflon". "Delrin" and "Teflon" are polymer compounds used regularly in the semiconductor industry and are registered trademarks of E. I. Du Pont De Nemours and Company of Wilmington, Del. It is also possible to plate a portion of support structure 20 using one of the above mentioned materials. If a portion of the support structure 20 or the structure 20 itself is formed of a nonconductive material, conductive plugs or portions are preferably present to provide a conductive path.

In a preferred embodiment, the support structure includes two conductive areas, an outer conductive area 24 and an inner conductive area 26, separated by the mesh cavity 22 that may be made of either a conductive or nonconductive material. Preferably, areas 24 and 26 are made of a metal or metal alloy. In another embodiment of the device, both areas 24, and 26 may be made of a nonconductive material such as plastic, and conductive plugs may be provided in areas 24 and 26 to form a conductive path between the support structure 20 and the wafer 50 being tested.

Support structure 20 can be formed to have a recessed portion 22 that receives and supports a porous surface-texturized sheet 25. As illustrated in FIG. 1, the sheet 25 is supported in the recessed cavity 22 on the support 20. A non-porous, air-impermeable, thin flexible sheet, or adhesive film 30 covers the fabric sheet 25 and extends beyond the perimeter of the sheet 25. It is essential that the adhesive film 30 not extend beyond a conductive area 24 located on the perimeter of the support structure 20 in order to form a conductive path between the support structure 20 and the semiconductor dies on the wafer 50 to be tested. The selected diameter of the film 30 is dependent on the diameter of the wafer 50 that is supported on the structure 20. It is further preferred that the adhesive film 30 have a top surface that is substantially planar with a top surface of the conductive areas of the support structure 20.

The marginal edges of adhesive film 30 are attached to the support structure 20 by any suitable means as, for example, by use of an adhesive, such as a pressure sensitive adhesive, not shown, or simply by non-adhesive frictional and interfacial forces between a smooth portion of the base member and the marginal edges of film 30, to provide a sealing engagement between the support structure 20 and film 30 along the marginal edges, or perimeter, thereof. In a preferred embodiment, the adhesive film is attached to the support structure 20 by means of a pressure sensitive adhesive that is provided in a groove or glue cavity 32 along the perimeter of the recessed cavity 22.

As noted above, flexible sheet 25 that is sandwiched between the adhesive film 30 and support structure 20, is porous, or permeable to allow for the passage of air through. Thus, a vacuum produced anywhere on sheet 25 is transmitted through to the adhesive film 30 supported thereon. As shown in the figures, flexible sheet 25 is adapted for connection to a low air pressure, or vacuum, source through an opening or a plurality of openings 40 formed in the support structure 20.

The flexible sheet 25 includes an array of fiber crossover points and spaces between the crossovers. As a result, there is essentially point contact with the support structure 20 upon which the flexible sheet is supported, and with the adhesive film 30 supported thereby. The effect of this arrangement is to allow for an easy distribution of a vacuum through the entire surface of the fabric sheet 25, even though the sheet 25 appears to lie flat on the support structure 20. The sheet 25 may be made of either conductive or nonconductive material, such as metallized fiber or fabric, provided the fabric is porous to allow for the drawing of air through it.

A vacuum chuck, or table, 42 may be used to connect the openings 40 to a vacuum source as is conveniently known in the art. All illustrated, a chuck 42 includes vertical walls 44 which define a recess 46 in the upper face thereof. Downwardly extending walls 48 on the support structure 20 surround the walls 44 of the chuck when the support structure is positioned on the chuck, and a substantially fluid tight chamber is defined between the bottom of the support structure 20 and recess 46 in the chuck 42. A opening 43 in the vacuum chuck is provided for connection of the recess 46 to a vacuum, or low pressure, source through a control valve 54. Low pressure in the chamber between the chuck 42 and support structure 20 is communicated through the opening 40 in the support structure 20 and thus through the permeable, or porous, texturized fabric sheet 25 to the impermeable adhesive film 30 to draw portions of the film 30 into crevices, or interstices, in the upper face of the texturized fabric sheet 25.

Figure 2:
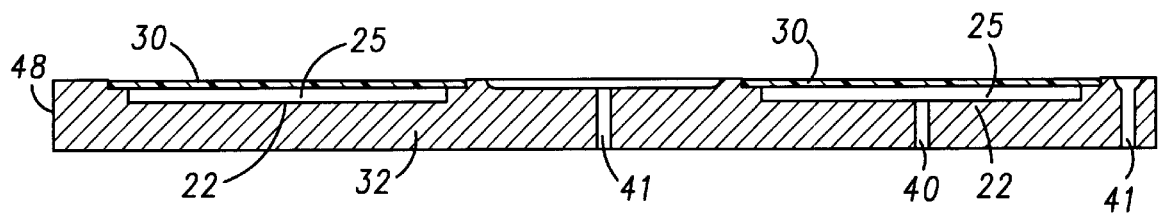
FIG. 2 is a cross sectional view of the apparatus of FIG. 1 taken along lines 1—1.

The adhesive film 30 may comprise, for example, an elastomeric member having a smooth upper face to provide for high interfacial retention forces between the film 30 and the device, such as chip on the wafer 50, that is supported on the film. The selected width of the film 30 is relative to the weight of the wafer 50 to be supported on the support structure 20. Interfacial retention forces may be increased, if desired, by use of an adhesive, such as a pressure sensitive adhesive, not shown, at the upper face of the film 30. For decreased interfacial retention forces, a film 30 having a texturized upper face may be used. In any event, interfacial retention forces are provided for securely holding the device on the film 30 such that the device can not be readily or conveniently removed using conventional tweezers or vacuum techniques while the film 30 is in a flat position as illustrated in FIG. 2.

To facilitate removal of the wafer from the film 30, surface contact between the film 30 and device is reduced by drawing portions of the film 30 into crevices, or interstices, in the upper face of texturized fabric sheet 25 by application of a vacuum thereto. Texturized sheet 25 simply may comprise a woven, knit, braid, lace, knit-sew, or like fabric made of natural or synthetic "over and under" crossing fibers or yarns, which fabric is inherently porous and has a texturized surface. By reducing the magnitude of the force by which the wafer is attached to the film 30, the wafer the chip, is readily removable from the sheet as by use of a vacuum wand, tweezer, or the like.

Support structure 20 can be further detailed to have an alignment flat 28 used to align a flat 29 of semiconductor substrate 50 to the alignment flat 28 of support structure 20. When semiconductor substrate 50 is in support structure 20, a vacuum pressure can be applied to the backside of semiconductor substrate 50 through vacuum openings 41.

Figure 3:
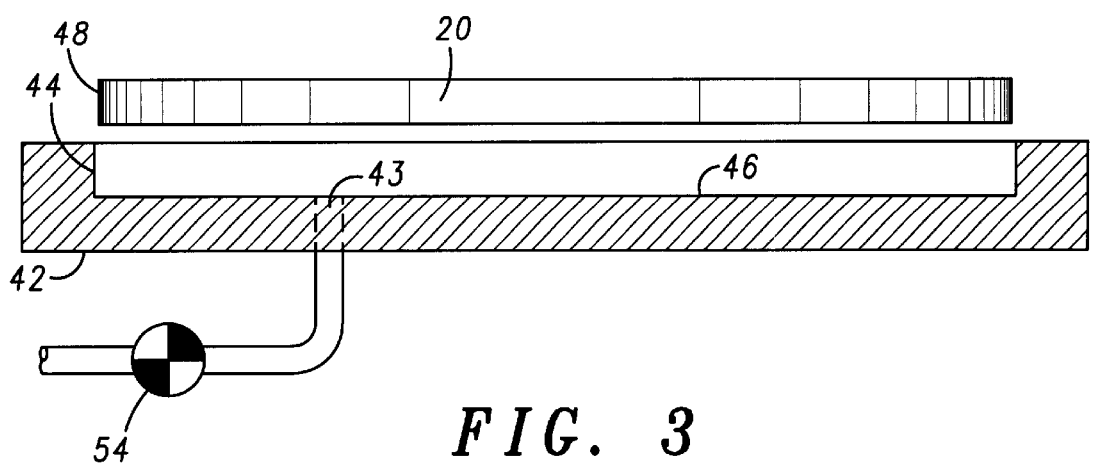
FIG. 3 is a cross sectional view of the vacuum chuck for receiving support structure shown in FIG. 1.

One method for using the testing device 10 is to align a wafer 50 to the alignment flat 28 and vacuum pressure is then applied through vacuum openings 40 to ensure that the top surface of wafer 50 is planar. The wafer 50 may then be thinned down and further processed during an assembly process until the wafer 50 is ready for electrical testing. To assure electrical contact between wafer 50 and the conductive area 24 during testing a vacuum or low pressure source may be applied through source 44 as illustrated in FIG. 3. A bias or ground potential is placed on the backside of semiconductor substrate 50 and the semiconductor devices on the topside of wafer 50 can then be probed. After electrical testing, the testing device can be used to transport the wafer 50 to the next fabrication process, which may include wafer bonding or final assembly.

By now it should be appreciated that the present invention provides a testing device 10 for the transporting, processing, or electrically testing of a thin semiconductor substrate 50. An adhesive film 30 is disposed on a textured sheet 25 and does not extend beyond the perimeter of the sheet 20. Thus an electrically conductive path between the support structure 20 and devices on the wafer 50 is provided to enable a bias potential to the chips during electrical testing. The testing device 10 offers a significantly improved method for processing and testing thin wafers that will significantly improve the yield of active devices produced.

Although the invention has been described with reference to specific embodiments, it will be understood by those skilled in the art that various changes may be made without departing from the spirit or scope of the invention. For instance, the numerous details set forth herein such as, for example, material compositions, chemical concentrations, and layer thicknesses are provided to facilitate the understanding of the invention and are not provided to limit the scope of the invention. Accordingly, the disclosure of embodiments of the invention is intended to be illustrative of the scope of the invention and is not intended to be limiting. It is intended that the scope of the invention shall be limited only to the extent required by the appended claims.

We claim:

1. A testing device for semiconductor components comprising:

a support structure having an outer edge; and an adhesive film disposed on the support structure to hold a semiconductor wafer in position on the support structure so that neither the adhesive film nor the semiconductor wafer extends beyond the outer edge of the support structure; and a mesh layer having a plurality of openings therein for conducting air therethrough, said mesh layer disposed between the support structure and the adhesive film.

2. The testing device of claim 1 wherein the support structure provides a conductive path between a semiconductor component on the wafer and the support structure.

3. The testing device of claim 2 wherein the support structure comprises a conductive material.

4. The testing device of claim 3 wherein the conductive material is a metal or a metal alloy.

5. The testing device of claim 3 wherein the conductive material is a plug of a metal or metal alloy that is disposed within the support structure.

6. The testing device of claim 1 wherein the support structure is substantially the same shape as a shape of the semiconductor wafer.

7. The testing device of claim 6 wherein the support structure is circular in shape.

8. The testing device of claim 1 wherein the adhesive film is a plyable material with adhesive properties.

9. The testing device of claim 1 wherein the support structure further comprises a vacuum hole extending through the support structure to create a vacuum to pull the adhesive film through the mesh toward the support to release the wafer from the adhesive fill.

10. A method for testing a semiconductor device comprising:

a. selecting a support structure having an outer edge;
b. disposing an adhesive film on the support structure to hold a semiconductor wafer in position on the support structure so that neither the adhesive film nor the semiconductor wafer extends beyond the outer edge of the support structure, and positioning a mesh layer between the support structure and the adhesive film, said mesh layer having a plurality of openings therein for conducting air therethrough; and
c. probing a semiconductor component on the wafer to determine its viability.

11. The method of claim 10 wherein the disposing step further comprises providing a conductive path between the semiconductor component on the wafer and the support structure.

12. The method of claim 10 wherein the support structure comprises a conductive material.

13. The method of claim 10 wherein the adhesive film is a plyable material with adhesive properties.

14. The method of claim 10 wherein the selecting step further comprises forming a vacuum hole extending through the support structure to create a vacuum to pull the adhesive film away from the wafer towards the support structure and to permit the release of the wafer from the adhesive film.

15. The method of claim 10 wherein the adhesive film is a plyable material with an adhesive film.

16. A method for testing a semiconductor device comprising:

a) selecting a support structure having an outer edge;

b) disposing an adhesive film on the support structure to hold a semiconductor wafer in position on the support structure so that neither the adhesive film nor the semiconductor wafer extends beyond the outer edge of the support structure, and positioning a mesh layer between the support structure and adhesive film, said mesh layer having a plurality of openings therein for conducting air therethrough;

c) forming a conductive path between a semiconductor component on the wafer and the support structure; and d) probing a semiconductor component on the wafer to determine its viability.

17. The method of claim 16 wherein the support structure comprises a conductive material.

* * * * *